(12) United States Patent
Ait-Mani et al.

(10) Patent No.: US 9,337,037 B2
(45) Date of Patent: May 10, 2016

(54) METHOD FOR OBTAINING A HETEROGENEOUS SUBSTRATE FOR THE PRODUCTION OF SEMICONDUCTORS

(71) Applicant: COMMISSARIAT A L'ENERGIE ATOMIQUE ET AUX ENERGIES ALTERNATIVES, Paris (FR)

(72) Inventors: Abdenacer Ait-Mani, Saint Egreve (FR); Stephanie Huet, Beaulieu sur Loire (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/356,960

(22) PCT Filed: Oct. 31, 2012

(86) PCT No.: PCT/IB2012/056061
§ 371 (c)(1),
(2) Date: May 8, 2014

(87) PCT Pub. No.: WO2013/068891
PCT Pub. Date: May 16, 2013

(65) Prior Publication Data
US 2014/0306268 A1    Oct. 16, 2014

(30) Foreign Application Priority Data
Nov. 9, 2011   (FR) ...................................... 11 60193

(51) Int. Cl.
*H01L 21/02* (2006.01)
*H01L 25/00* (2006.01)
(Continued)

(52) U.S. Cl.
CPC ........ *H01L 21/187* (2013.01); *H01L 21/02002* (2013.01); *H01L 21/304* (2013.01); *H01L 21/6835* (2013.01); *H01L 29/205* (2013.01);
(Continued)

(58) Field of Classification Search
CPC ................... H01L 25/0657; H01L 2924/1517; H01L 25/0753
See application file for complete search history.

(56) References Cited

U.S. PATENT DOCUMENTS 6,248,646 B1   6/2001  Okojie
7,960,247 B2 * 6/2011  Thompson et al. ........... 438/459
(Continued)

FOREIGN PATENT DOCUMENTS

EP       2 339 617      6/2011
WO      2005/083774    9/2005

*Primary Examiner* — Victor A Mandala
*Assistant Examiner* — Regan J Rundio
(74) *Attorney, Agent, or Firm* — Clark & Brody

(57) ABSTRACT

A method for obtaining a heterogeneous substrate intended for use in the production of a semiconductor comprises the following steps: (a) obtaining a first substrate (2) made from a type II-VI or type III-V material and a second substrate (1), each substrate being substantially planar and each substrate having a pre-determined surface area; (b) grinding a non-through recess (10) into the second substrate (1), the surface area of said recess being greater than the surface area of the first substrate, such that the first substrate can be housed in the recess; (c) depositing a bonding material (15) in the recess (10); (d) depositing the first substrate (2) in the recess (10) of the second substrate and securing the first substrate in the second substrate at a temperature below 300° C.; and (e) leveling the first and second substrates in order to obtain a heterogeneous substrate having a substantially planar face (30).

7 Claims, 2 Drawing Sheets

(51) Int. Cl.
*H01L 31/0232* (2014.01)
*H01L 21/18* (2006.01)
*H01L 21/683* (2006.01)
*H01L 21/304* (2006.01)
*H01L 29/205* (2006.01)
*H01L 29/225* (2006.01)
*H01L 27/146* (2006.01)
*H01L 31/0203* (2014.01)
*G02B 13/00* (2006.01)

(52) U.S. Cl.
CPC .......... *H01L 29/225* (2013.01); *G02B 13/0085* (2013.01); *H01L 25/00* (2013.01); *H01L 27/14618* (2013.01); *H01L 31/0203* (2013.01)

(56) References Cited

U.S. PATENT DOCUMENTS

| | | | | |
|---|---|---|---|---|
| 8,124,439 | B2 * | 2/2012 | Bolis | G02B 13/0085 257/E31.127 |
| 2002/0020898 | A1 * | 2/2002 | Vu et al. | 257/676 |
| 2006/0202322 | A1 * | 9/2006 | Kariya et al. | 257/698 |
| 2009/0091020 | A1 * | 4/2009 | Wei et al. | 257/705 |
| 2011/0085577 | A1 * | 4/2011 | Krasulick et al. | 372/45.01 |
| 2012/0280381 | A1 * | 11/2012 | Beyne et al. | 257/680 |

* cited by examiner

METHOD FOR OBTAINING A HETEROGENEOUS SUBSTRATE FOR THE PRODUCTION OF SEMICONDUCTORS

The invention relates to the field of microelectronics.

It relates to a method enabling a semiconductor material substrate to be made of dimensions that are compatible with the standards used in microelectronics, while starting from a substrate that does not correspond with such standards.

In microelectronic fabrication, various substrates may be used depending on applications. Substrates present dimensions and shapes that differ and they may also be made of materials that are different.

Thus, silicon substrates are available in the form of a disk having a diameter that may be 100 millimeters (mm), 150 mm, 200 mm, or indeed 300 mm.

Furthermore, technical equipment is specifically adapted to particular substrate dimensions.

Such equipment is designed in particular for deposition, etching, cleaning, or indeed measuring operations.

Various technologies incorporating specific pieces of equipment thus need to be available in order to treat silicon substrates of sizes that are different.

Nevertheless, there exist other types of substrate, in particular those intended for the photovoltaic industry. Those substrates are generally square or round in shape and they present dimensions that are smaller than the dimensions of silicon substrates.

Thus, by way of example, substrates made of II-VI type material such as CdTe or CdHgTe are in the form of plates that are substantially square having dimensions that are typically 36 mm×38 mm or 47 mm×48 mm. Furthermore, substrates made of material of III-V type such as InSb, InP, InAs, or GaAs are in the form of plates having a diameter that is typically 2 inches (") or 3", or indeed 100 mm.

Those substrates are not easily treated in technological equipment designed for a silicon substrate of larger dimensions.

That is why methods have been developed for obtaining a substrate of greater diameter starting from a substrate of smaller diameter.

Thus, document EP 2 339 617 describes a method consisting in using a first substrate in which a through hole is made of surface area that is greater than the surface area of a second substrate of dimensions that are too small for enabling it to be treated in the equipment available.

When performing the method, the two substrates are temporarily fastened to a first support. The second substrate is placed inside the first substrate and the space left empty between the two substrates is filled with a material. The assembly is then fastened on a second support, prior to removing the first support, such that the active zone of the second substrate is apparent.

That method presents the drawback of being relatively complex, in particular because it uses two different supports.

Furthermore, the through hole is formed in the first substrate by making a circular cut. That may be performed in particular using a diamond blade. Unfortunately, such cutting conventionally produces splinters on the substrate. Those splinters are even more present on substrates that are of considerable thickness or on substrates that are made of materials that are hard.

This weakens the substrate, and may lead to cleaving so as to make the substrate unusable.

An object of the invention is to mitigate those drawbacks by proposing a method of obtaining a heterogeneous substrate for use in semiconductor fabrication, which method is simpler to implement and limits any risk of deteriorating the substrate.

According to the invention, the method comprises the following steps:

a) providing a first substrate of II-VI or III-V type material and a second substrate, the substrates being substantially plane and each presenting a determined area;

b) making a non-through recess in the second substrate by grinding, the area of this recess being greater than the area of the first substrate, such that the first substrate can be received in said recess;

c) depositing an adhesive material in said recess;

d) depositing the first substrate in the recess in the second substrate and fastening it in the second substrate, at a temperature lower than 300° C.; and e) leveling the first and second substrates in order to obtain a heterogeneous substrate presenting a face that is substantially plane.

In preferred manner, a step of polishing the recess is performed between the steps b) and c).

This polishing serves to recover the original surface state for the material constituting the substrate, after the recess has been made.

Furthermore, a texturing step may be performed in the bottom of the recess between steps b) and c).

In preferred manner, the second substrate is made of a material having a Young's modulus that is greater than 50 gigapascals (GPa).

By using a substrate that is relatively rigid and that presents increased mechanical strength, it is possible to limit the appearance of defects while making the recess, which defects might generate splinters or cleaving and weaken the substrate.

Also in preferred manner, the difference between the coefficients of thermal expansion of the first and second substrates is less than 28% in the temperature range 0° C. to 300° C.

Limiting the difference between the coefficients of thermal expansion of the two substrates makes it possible to limit any risk of the assembly between the two substrates deteriorating as a result of thermal expansion.

Step e) is advantageously performed by grinding.

The method of the invention may also consist in depositing a passivation layer on both substrates, after step e).

The method may also include a final step consisting in thinning the two substrates.

Finally, the invention provides a heterogeneous substrate for use in semiconductor fabrication, the substrate comprising:

a first substantially plane substrate presenting a determined surface area and made of II-VI or III-V type material;

a second substantially plane substrate presenting a non-through recess, the surface area of the recess being greater than the surface area of the first substrate; and the first substrate being arranged in the second substrate with a gap being arranged between the two substrates, which gap is filled with an adhesive material, and the face in which both substrates are flush is substantially plane.

In preferred manner, this face is covered in a passivation layer.

The invention can be better understood and other objects, advantages, and characteristics thereof appear more clearly on reading the following description, which is made with reference to the accompanying drawings, in which.

Elements common to more than one of the figures are identified with the same references.

Figure 1:
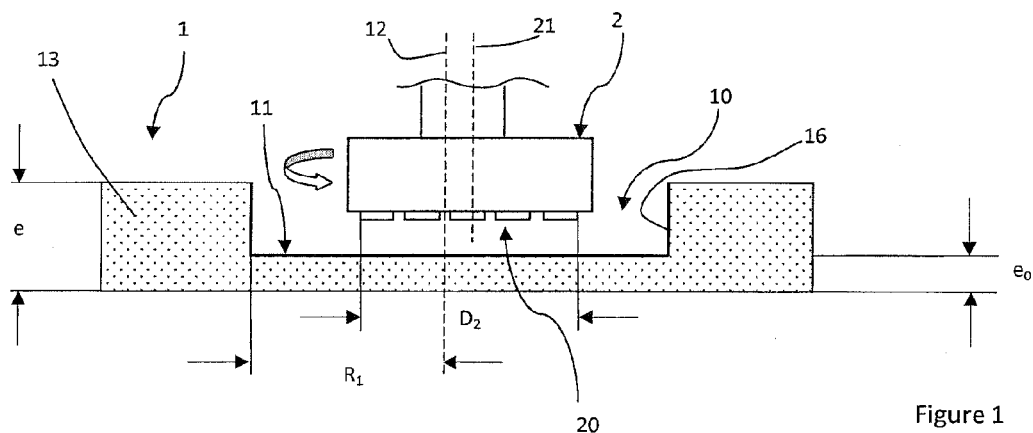
FIG. 1 is a section view of a substrate in which a recess is being made.

FIG. 1 shows a step in the method of the invention in which a substrate 1 is machined by means of a grinder device 2.

The substrate 1 is substantially plane and at the beginning of this machining step it presents a thickness e that is substantially constant.

The substrate 1 is preferably made of a material presenting a Young's modulus greater than 50 GPa. This limits any risk of forming machining swarf. This also limits any risk of scratches appearing or of obtaining a surface that is not polished, and also limits any risk of the surface of the substrate being weakened.

The materials constituting the substrate 1 may in particular be: silicon, germanium, sapphire, borosilicate glass, or indeed most ceramics such as glass-ceramic, alumina, silicon carbide, or aluminum nitride.

The substrate 1 may in particular be in the form of a disk of diameter that may for example be 150 mm, 200 mm, or 300 mm, and its thickness may lie in the range 725 micrometers (µm) to 1 mm.

A non-through recess 10 is made in the substrate 1 by means of a grinder tool 2, thereby limiting any risk of weakening the substrate.

That is why this substrate preferably presents a surface of planeness that complies with the standards in force in microelectronics (SEMI standards). The grinder tool may thus be parallel to the surface of the substrate, thereby limiting any stress generated by grinding. When planeness of the surface is not ensured, the grinder tool presents an angle relative to the surface of the substrate that is not zero, thereby leading to a large amount of contact stress over a small area.

The thickness $e_0$ of the substrate in the bottom 11 of the recess must be large enough to avoid weakening the substrate.

In general, it can be considered that the thickness $e_0$ should be greater than 200 µm. Thus, a recess presenting a depth of 725 µm may be made in a substrate having a thickness of 1 mm, whereas a recess presenting a depth of 500 µm may be made in a substrate having a thickness of 725 µm.

The recess 10 may be made in particular by performing the method described in Document U.S. Pat. No. 7,705,430. That method differs from conventional grinding techniques in that grinding is performed only within an inside circumference of the substrate, thereby leaving an edge on the outside circumference of the substrate.

The presence of this outside edge on the substrate makes it possible in particular to reduce any risk of the substrate becoming deformed, and it improves its strength.

In practice, the method consists in using a grinder tool 2 in which the outside diameter D2 of the active portion 20 of the tool is greater than the radius R1 of the recess 10 that is to be formed.

The grinder tool 2 is positioned relative to the substrate 1 in such a manner that the outer peripheral edge of the active portion 20 is inscribed inside the peripheral limit of the recess 10 that is to be formed. Furthermore, the active portion 20 of the tool 2 is placed across the central axis 12 of the substrate 1 and the tool 2 is driven in rotation about its own central axis 21.

When the tool 2 is driven in rotation, it is also gradually moved downwards so as to penetrate into the substrate 1. The substrate is mounted in a tool carrier, which is itself driven in rotation.

Thus, the method makes it possible to form the recess 10 while maintaining an outside annular edge 13 at the periphery of the substrate 1, which edge presents a thickness that corresponds to the initial thickness e of the substrate.

The inside wall 16 of the edge 13 is substantially vertical relative to the bottom wall 11 of the recess.

Unlike conventional grinding methods, this method does not require the substrate to be previously fastened on a support made of rigid material, such as glass. On the contrary, the substrate is fastened directly to the tool carrier. This makes it possible to simplify performing the method and thus constitutes an advantage compared with conventional methods.

Furthermore, by using an appropriate grinder tool, the method makes it possible to obtain a smooth finish on the surface of the recess 10. This type of finish guarantees a minimum of defects in the surface of the recess.

Nevertheless, a substrate made of hard material is always ground in two or three steps, with the early steps being performed using grindwheels with coarse grains.

It may be observed that the absence of splinters is enhanced by removing material in successive fine layers and by the grindwheel and the substrate moving relative to each other.

This grinding step is performed at ambient temperature. Nevertheless, at this stage, there is no constraint on temperature level.

In general, this step limits the mechanical stresses generated in the substrate 1.

Once the recess 10 has been made, another step may be performed to eliminate any mechanical stresses that result from the initial steps of grinding.

Once a material has been ground, it loses its original surface state over a thickness of a few micrometers. This applies in particular for a material that is monocrystalline. Thus, with silicon, the crystal lattice is damaged or work-hardened to a depth lying in the range 1 µm to 2 µm.

This work-hardening of the surface of the recess 10 can lead to the substrate being deformed as a result of discontinuities in the crystal lattice that might generate stresses.

This additional step consists in polishing the inside surface of the recess 10. By means of this step, the inside surface of the recess recovers the atomic or crystalline arrangement that originally existed in the substrate 1. This makes it possible to guarantee mechanical stability for the substrate during temperature annealing.

The method may also consist in performing a plurality of grinding steps and of polishing steps successively and in alternation. This serves to relax stresses progressively.

The making of the recess 10 may involve wet chemical etching if the substrate is monocrystalline.

That makes it possible to obtain surfaces that are very smooth. Nevertheless, the time required for etching is long when the thickness of the substrate that needs to be removed is greater than a few hundreds of micrometers.

When the substrate is made of silicon, the recess may be made by a machining technique based on fluorinated plasmas. That technique alternates with steps of etching using $SF_6$ and of passivation, e.g. using $C_4F_8$.

It enables silicon to be etched in depth, but it gives rise to rounded edges.

Figure 2:
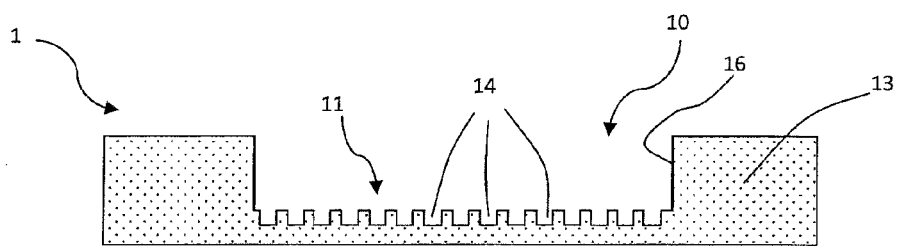
FIG. 2 is a section view of a substrate presenting a recess with a bottom that has been grooved.

FIG. 2 shows another step of the method of the invention in which grooves 14 are made in the bottom 11 of the recess 10 in order to provide texturing.

The grooves shown in FIG. 2 are regular and, by way of example, they are distributed in two series of parallel lines that intersect at right angles. This enables stress to be distributed annularly and avoids any risk of the structure cleaving.

The grooves may in particular be made by means of a laser. For example, they may present a width and a height lying in the range a few micrometers to 50 µm, and they may typically be about 25 µm.

Instead of grooves 14, the method may consist in performing random texturing on the bottom 11 of the recess 10 by chemical etching.

Nevertheless, it is more difficult to obtain random texturing than it is to obtain grooves. In particular, it is found to be more difficult to obtain roughness of the order of a few micrometers by chemical etching than it is by using a laser.

Because of the polishing of the recess, it should be observed that the texturing is performed on a layer that is stable.

The advantage of texturing that is regular or random is explained in the description below.

Figure 3:
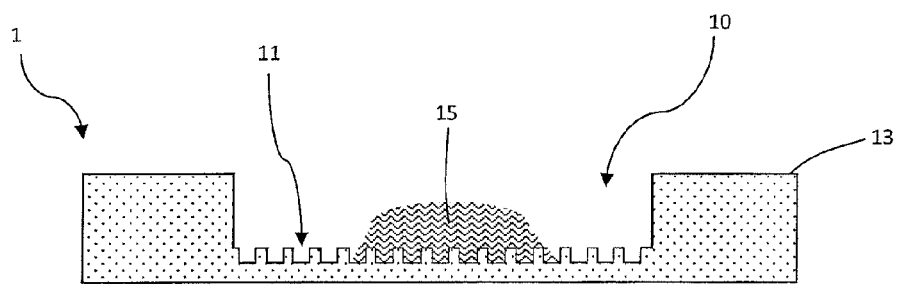
FIG. 3 shows the FIG. 2 substrate with adhesive deposited on the bottom of the recess.

FIG. 3 shows a following step of the method, in which a calibrated drop of adhesive material is deposited on the bottom 11 of the recess 10.

The adhesive material may consist in particular of an epoxy resin, a polyimide, a benzocyclobutene adhesive, or indeed a material sold by the supplier Brewer Science under the name WaferBOND HT-10.10.

This adhesive material is for fastening another substrate in the substrate 1, as described with reference to FIG. 4.

Thus, the volume of adhesive that is deposited in the recess 10 is calculated beforehand on the basis of the gap that needs to be filled between the two substrates and on the thickness desired for the joint.

By measuring out an appropriate volume, only the necessary volume of adhesive is deposited in the recess. This makes it possible to limit the quantity of adhesive that might emerge from the substrate 1 after the other substrate has been inserted into the recess 10.

It may also be observed that the adhesive material advantageously presents viscosity that is low enough to enable it to spread over the inside surface of the recess 10 at ambient temperature. Furthermore, and in preferred manner, it does not contain any fillers. Fillers might give rise to bonding defects.

In preferred manner, before depositing the drop of adhesive 15, the inside surface of the housing 10 may be subjected to plasma/oxygen treatment. This treatment serves to improve wetting by the adhesive material and to limit the creation of bubbles that might lead to bonding defects.

In this respect, it should be observed that the texturing of the bottom of the recess by a laser or a chemical method, as shown in FIG. 2, serves to increase the contact area between the adhesive material and the substrate 1, and thus to increase the total area of bonding between the two substrates, thereby making the bonding more reliable.

Figure 4:
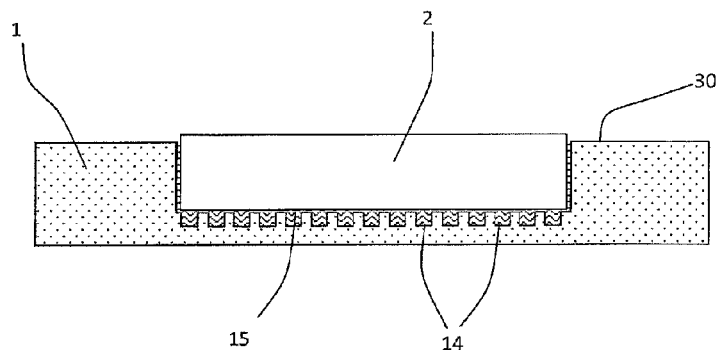
FIG. 4 is a section view of the FIG. 3 substrate after another substrate has been put into place in the recess.

FIG. 4 shows a following step of the method, in which a substrate 2 is inserted in the housing 10 in the substrate 1.

The substrate 2 is substantially plane and presents a surface area that is smaller than the surface area of the recess 10.

The substrate 2 may be of any shape, insofar as it is capable of being inserted in a recess that is circular.

The substrate is typically made of a material of the II-VI or the III-V type, for the purpose of infrared detection.

By way of example, for a substrate 2 made of a material of the CdTe type and presenting dimensions of 36 mm×38 mm, the substrate 1 may present a recess having a diameter greater than 54 mm.

It is preferable to minimize the spacing between the two substrates.

For example, this spacing may be less than or equal to 100 µm when the substrate 2 is in the form of a disk.

The substrate 2 may be placed in the substrate 1 in particular by means of a specific assembly bench serving to guarantee that one of the substrates is centered relative to the other. Both substrates appear at the surface of the face 30 of the resulting assembly.

Mention may be made in particular of the equipment commonly known as "wafer bonders" sold under the name EVG by the supplier EVGroup, or the equipment sold under the name SE8 or CB8 by the supplier SÜSS MicroTec AG.

Once the substrate 2 is in place in the recess 10, it is fastened in the recess by means of the adhesive material. This may be achieved in particular by curing the adhesive material.

Prior to the curing step, two pressure points are advantageously applied to the substrate 2 in order to initiate a bonding wave.

With an epoxy adhesive, the curing step is performed at a temperature of 150° C. for 1 hour (h). With a polyamide adhesive, the curing step may be performed at a temperature lying in the range 280° C. to 300° C. for a period of 30 minutes (min) to 60 min.

Insofar as II-VI or III-V materials present a melting temperature lying in the range 300° C. to 600° C., it is necessary for the bonding step to be performed at a temperature lower than 300° C.

When the substrate 2 includes photodiodes, complying with this temperature threshold also makes it possible to avoid diffusion of doping species present in the photodiodes.

It should be observed that the presence of texturing in the bottom of the recess enables bubbles of air, if any, to escape during the step of curing the adhesive material. This also makes it possible to improve the bonding between the two substrates.

The material constituting each of the substrates 1 and 2 is preferably selected in such a manner that their coefficients of thermal expansion are relatively close together.

In practice, the difference between the two coefficients of thermal expansion is preferably less than 28% in the temperature range 0° C. to 300° C.

This condition makes it possible to limit any risk of the assembly made up of the two substrates deteriorating.

When the difference between the coefficients of thermal expansion of the two substrates is too great, then during a rise in temperature this difference may lead to cleaving of the less rigid substrate. It is the more rigid substrate that imposes its movement and the assembly becomes curved (like a bimetallic strip). Thus, relative movement between the two substrates that is too great can lead to deterioration of the assembly.

In general, the coefficient of thermal expansion of the two substrates vary differently with temperature. Unfortunately, the two assembled-together substrates may be subjected to temperature rises. This may be due to the way in which the two substrates are bonded together (e.g. using hot adhesive) or to technological operations that may be performed on the assembly (e.g. adhesion annealing or deposition).

When the coefficients of thermal expansion of the two substrates are relatively close together, the amount of stress that one substrate can exert on the other in the event of a temperature rise is limited.

By way of example, two assemblies have been made. In both cases, the substrate 2 was made of indium antimonide (InSb). In the first assembly, the InSb substrate 2 was placed in a substrate 1 made of germanium, (Ge), while in the other assembly, it was placed in a substrate 1 made of silicon (Si). In both assemblies, the substrate 1 had a diameter of 200 mm and the substrate 2 had a diameter of 100 mm.

In the first assembly, the difference between the two coefficients of thermal expansion of the substrate was less than 0.8 parts per million (ppm) per kelvin (ppm/° K), whereas in the second assembly, it was greater than 2 ppm/° K. These values are given for the temperature range ambient temperature to 300° C.

Both assemblies were subjected to a temperature rise from ambient temperature up to 200° C.

It was found that the first assembly was subjected to relatively little deformation, with an offset of 3 μm, while the second assembly was subjected to a large amount of deformation, with an offset of 980 μm (offset due to curvature measured at the center of the substrate).

Thus, a small difference between the two coefficients of thermal expansion limits any risk of stresses between one substrate and the other during a temperature rise that is imposed, in particular by the way in which they are assembled together.

Nevertheless, even if the coefficients of thermal expansion of the substrates are relatively close together, they will vary differently with temperature.

When the coefficient of thermal expansion of the adhesive material is selected so as to be greater than the coefficient of thermal expansion of both substrates, then it is the adhesive material that absorbs the resulting stresses. Thus, when the coefficient of expansion of the adhesive material is ten times greater than that of the substrates 1 and 2, the adhesive material produces a buffer effect that prevents stresses being transferred from one substrate to the other. The movements between the two substrates due to a rise in temperature are reduced to small movements of the substrate 2 inside the recess 10.

Thus, under such circumstances, the adhesive material provides a large range of flexibility.

Figure 5:
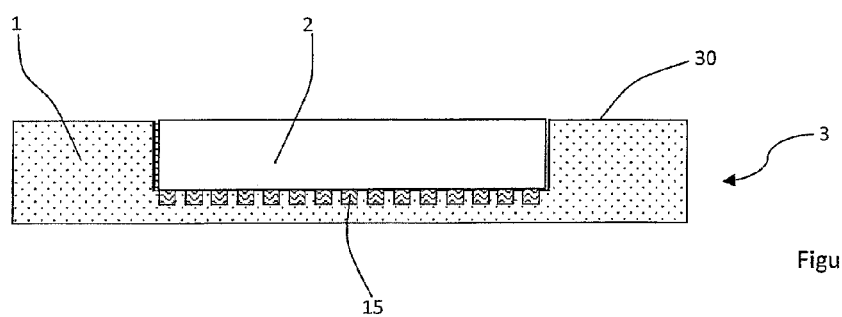
FIG. 5 is a view similar to FIG. 4 showing the two substrates after they have been leveled.

FIG. 5 shows a following step of the method in which the substrates are leveled after they have been assembled together. FIG. 5 shows the substrate 3 after such leveling. The face 30 of the assembly in which both substrates appear is then substantially plane. Thus, because of the presence of the adhesive, no gap is present between the two substrates.

The method of the invention then makes it possible to provide a heterogeneous substrate that may in particular be subjected to a lithographic step on its face 30.

It should be observed that this is not possible when the lateral gap between the two substrates is large and the assembled-together substrates do not define a surface that is plane.

This leveling step may be performed by a grinding operation.

This operation may be performed even if the two substrates present coefficients of thermal expansion that are relatively far apart. The harder material then imposes its parameters on the other material.

Nevertheless, it should be observed that if the difference between the coefficients of thermal expansion of the two substrates is small, then the bimetallic effect is small. As a result, the assembly may present only a small amount of bulging. Thus, during grinding, the quantity of material that is to be removed is likewise small.

When the lateral gap between the two substrates is minimized, this avoids any indentation being formed in the adhesive filling the gap during the grinding step.

Finally, after this step of mechanically leveling the two substrates, it is also possible to perform a chemical-mechanical planarization (CMP) type polishing step or a dry polishing step based on felts of ultrafine grain size.

This latter step makes it possible to obtain a better surface state for the face 30 of the assembly.

Figure 6:
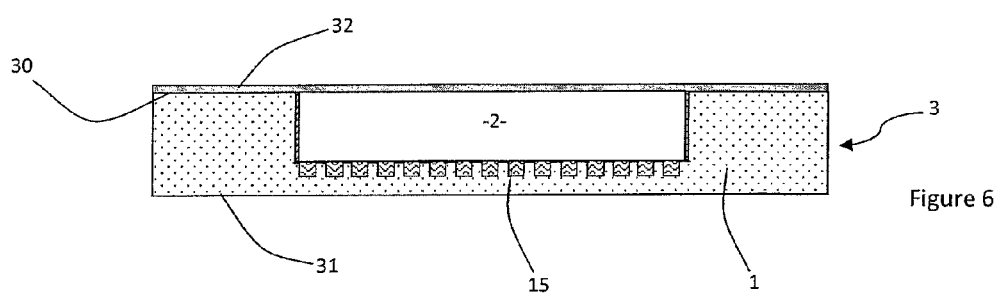
FIG. 6 is a view similar to FIG. 5 showing a passivation layer on the assembly of two substrates.

FIG. 6 shows another step of the method in which a passivation layer 32 is deposited on the face 30 of the assembly 3 shown in FIG. 5.

This passivation layer is made of an insulating oxide such as SiO, $SiO_2$, or $Si_3N_4$. The selected oxide must be compatible with the technology being used.

Its function is to protect the face 30.

In addition, by means of this passivation, only one type of material is apparent in the face 30. This is necessary for the subsequent steps of photolithography, etching, or deposition.

Finally, this oxide layer serves to stabilize the assembly 3 by protecting it from external contaminants, if any.

The assembly as obtained in this way may be treated with technological equipment appropriate for the dimensions of the substrate 1 and thus for dimensions greater than those of the substrate 2. The assembly can thus be treated and handled without problem by equipment that was not designed for the substrate 2.

Figure 7:
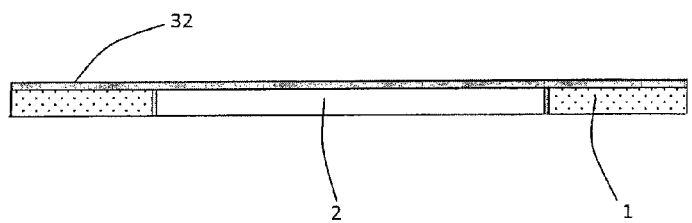
FIG. 7 shows the FIG. 6 assembly after thinning of the substrate.

FIG. 7 shows a final step of the method, in which the assembly 3 is thinned on its side opposite from the passivation layer 32.

The resulting wafer may then be cut up to obtain individual chips.

The method of the invention thus makes it possible to reconstitute a substrate presenting dimensions that are compatible with the standards of microelectronics by using an assembly that is heterogeneous, both concerning the materials constituting the assembly and the dimensions of the elements making up the assembly.

The reference symbols included after the technological characteristics featuring in the claims have the sole purposes of facilitating understanding of the claims and do not in any way limit their scope.

The invention claimed is:

1. A method of obtaining a heterogeneous substrate for use in semiconductor fabrication, the method comprising the following steps:
   a) providing a first substrate (2) of II-VI or III-V type material and a second substrate (1), the substrates being substantially plane and each presenting a determined area;
   b) making a non-through recess (10) in the second substrate (1) by grinding, the area of this recess being greater than the area of the first substrate, such that the first substrate can be received in said recess;
   c) polishing the recess (10);
   d) depositing an adhesive material (15) in said polished recess (10);
   e) depositing the first substrate (2) in the polished recess (10) in the second substrate and fastening it in the second substrate, at a temperature lower than 300° C.; and
   f) leveling the first and second substrates in order to obtain a heterogeneous substrate presenting a face (30) that is substantially plane.

2. A method according to claim 1, wherein a texturing step (14) is performed in the bottom of the recess (10) between steps b) and d).

3. A method according to claim 1, wherein the second substrate (1) is made of a material having a Young's modulus that is greater than 50 GPa.

4. A method according to claim 1, wherein the difference between the coefficients of thermal expansion of the first and second substrates is less than 28% in the temperature range 0° C. to 300° C.

5. A method according to claim 1, wherein step f) is performed by grinding.

6. A method according to claim 1, wherein a passivation layer (32) is deposited on the two substrates, after step f)).

7. A method according to claim 6, wherein a step is performed of thinning the two substrates on the side opposite from the passivation layer (32).

* * * * *